United States Patent
Stoehr et al.

(10) Patent No.: US 10,598,328 B2
(45) Date of Patent: Mar. 24, 2020

(54) LIGHTING SYSTEM, HEADLAMP, AND METHOD FOR PRODUCING A LIGHTING SYSTEM

(71) Applicant: OSRAM GmbH, Munich (DE)

(72) Inventors: Joachim Stoehr, Giengen (DE); Philipp Helbig, Heidenheim (DE); Stephan Schwaiger, Herbrechtingen (DE)

(73) Assignee: Osram GmbH, Munich (DE)

( * ) Notice: Subject to any disclaimer, the term of this patent is extended or adjusted under 35 U.S.C. 154(b) by 0 days.

(21) Appl. No.: 16/106,004

(22) Filed: Aug. 21, 2018

(65) Prior Publication Data
US 2019/0063708 A1 Feb. 28, 2019

(30) Foreign Application Priority Data
Aug. 22, 2017 (DE) .................. 10 2017 214 636

(51) Int. Cl.
*F21S 41/24* (2018.01)
*F21S 41/663* (2018.01)
(Continued)

(52) U.S. Cl.
CPC .............. *F21S 41/24* (2018.01); *F21S 41/151* (2018.01); *F21S 41/192* (2018.01); *F21S 41/29* (2018.01); *F21S 41/663* (2018.01); *H05K 1/0274* (2013.01); *F21Y 2115/10* (2016.08); *H05K 1/181* (2013.01); *H05K 2201/10106* (2013.01); *H05K 2201/10121* (2013.01); *H05K 2201/10424* (2013.01); *H05K 2201/10522* (2013.01);
(Continued)

(58) Field of Classification Search
CPC ........ F21S 41/24; F21S 41/192; F21S 41/151; H05K 1/181; H05K 2201/10106; H05K 2201/10121; H05K 2201/10424; H05K 2201/10522; F21Y 2115/10
See application file for complete search history.

(56) References Cited

U.S. PATENT DOCUMENTS 9,618,174 B2 * 4/2017 Jungwirth ............. F21S 41/143
9,664,847 B2  5/2017 Krenn et al.
(Continued)

FOREIGN PATENT DOCUMENTS

DE  102012220457 A1  5/2014

OTHER PUBLICATIONS

German Search Report based on application No. 10 2017 214 636.2 (7 pages) dated Jan. 19, 2018 (for reference purpose only).

*Primary Examiner* — Donald L Raleigh (57) ABSTRACT

A lighting system includes an optical unit. The optical unit includes at least one light guide, which is provided for at least one light source. The lighting system further includes a retaining frame for the optical unit, via which frame the optical unit is fastened to a printed circuit board including the at least one light source, and a spacer for positioning the optical unit, which spacer is arranged between the retaining frame and the printed circuit board, the spacer having at least one continuous bearing opening in order to receive the at least one light guide. At least one guide recess is formed on the edge of the at least one bearing opening and at least one support face is provided on the edge, on which support face the light guide introduced into the bearing opening can be supported.

23 Claims, 5 Drawing Sheets

(51) Int. Cl.
*F21S 41/29* (2018.01)
*H05K 1/02* (2006.01)
*F21S 41/19* (2018.01)
*F21S 41/151* (2018.01)
*F21Y 115/10* (2016.01)
*H05K 1/18* (2006.01)

(52) U.S. Cl.
CPC ............... *H05K 2201/2036* (2013.01); *H05K 2203/167* (2013.01)

(56) References Cited

U.S. PATENT DOCUMENTS

| | | | |
|---|---|---|---|
| 9,816,678 B2* | 11/2017 | Krenn | G02B 6/0078 |
| 2006/0181894 A1* | 8/2006 | Chinniah | F21V 31/03 |
| | | | 362/547 |
| 2008/0253144 A1* | 10/2008 | Dolson | B60Q 1/0041 |
| | | | 362/547 |
| 2014/0133168 A1* | 5/2014 | Fiederling | F21S 41/143 |
| | | | 362/511 |
| 2014/0169014 A1* | 6/2014 | Jungwirth | F21S 41/143 |
| | | | 362/509 |
| 2016/0273727 A1* | 9/2016 | Maier | F21S 41/143 |

* cited by examiner

LIGHTING SYSTEM, HEADLAMP, AND METHOD FOR PRODUCING A LIGHTING SYSTEM

CROSS-REFERENCE TO RELATED APPLICATION

This application claims priority to German Patent Application Serial No. 10 2017 214 636.2, which was filed Aug. 22, 2017, and is incorporated herein by reference in its entirety.

TECHNICAL FIELD

Various embodiments relate generally to a lighting system including an optical unit, which includes at least one light guide, wherein the optical unit is arranged via a retaining frame on a printed circuit board including at least one light source. Various embodiments also relate to a headlamp including a lighting system, and to a method for producing a lighting system.

BACKGROUND

Vehicles which have an adaptive driving beam (ADB) as an additional accessory are known. For this purpose, light-emitting diodes (LEDs) arranged for example in a matrix-like manner can be used, wherein the LEDs are part of a module. Each individual LED or group of LEDs in the module can then be separately controlled and thus switched on and off and dimmed. In combination with a camera system and an image-processing electronics unit, oncoming traffic for example and vehicles traveling ahead are identified and masked out at least in regions. As a result, it is conceivable for example to drive permanently with "high beam" without dazzling other road users, e.g. if certain conditions are present. Examples of such conditions can be that the vehicle is traveling in a non-urban environment and/or has a speed of more than 50 km/h. Besides other road users, obstacles such as signs can also be masked out locally.

It is necessary that a light pattern of the module with the matrix-like LEDs be as homogeneous as possible, e.g. if there is no masking out, for example of other road users. At the same time, it is necessary that strong contrasts and steep gradients are provided in order to separate a dark area—for example in the region of a masked-out vehicle—from a light area, wherein the light area should lie as close as possible to the masked-out vehicle.

Document DE 102012220457 A1 discloses a lighting arrangement including one or more light sources and light-guiding optics (taper).

SUMMARY

A lighting system includes an optical unit. The optical unit includes at least one light guide, which is provided for at least one light source. The lighting system further includes a retaining frame for the optical unit, via which frame the optical unit is fastened to a printed circuit board including the at least one light source, and a spacer for positioning the optical unit, which spacer is arranged between the retaining frame and the printed circuit board, the spacer having at least one continuous bearing opening in order to receive the at least one light guide. At least one guide recess is formed on the edge of the at least one bearing opening and at least one support face is provided on the edge, on which support face the light guide introduced into the bearing opening can be supported.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

Various embodiments create a lighting system and a headlamp which are of simple design, can be produced economically and easily, and have a high light quality. Furthermore, various embodiments create a method with which a lighting system can be produced easily and economically.

In accordance with various embodiments a lighting system including an optical unit which includes at least one light guide is provided. The light guide is in turn provided for at least one light source. The lighting system may furthermore include a retaining frame for the optical unit, via which frame the optical unit can then be fastened to a printed circuit board including the at least one light source. A spacer for positioning the optical unit, e.g. for positioning the light guide, may also be provided. This spacer can be provided easily between the retaining frame and the printed circuit board. The spacer may include at least one continuous bearing opening in order to receive and orientate the at least one light guide. At least one guide recess is also formed in the spacer in addition to the bearing opening and may open out into the at least one bearing opening. Furthermore, at least one support face is provided, e.g. as considered in the circumferential direction of the bearing opening, on which support face the light guide introduced into the bearing opening can be supported. For this purpose, the light guide for example may include a step or a protrusion, which can then bear against the at least one support face from a certain insertion depth of the light guide, wherein a further displacement of the light guide into the bearing opening can be limited e.g. in the event of expansion of the light guide on account of a rise in temperature.

This solution may have the effect that as the light guide is inserted starting from the retaining frame, said light guide, if it is not inserted directly into the bearing opening, then encounters the guide recess and then slides via said recess into the bearing opening. A wedging of the light guide during assembly is thus avoided at the spacer. Furthermore, it is nevertheless ensured that the light guide inserted into the bearing opening can support itself as necessary on the at least one support face. By means of the at least one guide recess, the light guide is thus prevented from becoming wedged during assembly at the spacer and thus from being unable to be threaded or fully threaded into the spacer or threaded through the spacer. By means of the threading aid, no additional methods and/or tools are thus necessary in order to avoid or overcome a wedging of the light guide. A lighting system is thus created which can be produced reliably, consistently and with low equipment outlay. Even with small joining tolerances, a consistent modular assembly of the lighting system or light module with the taper optics and the spacer is now possible. Furthermore, compression of the light guide is avoided. The at least one guide recess is thus a "passive threading aid" for the light guide.

As a result of the lighting system according to various embodiments, as the light guide is threaded in, the surface pressure between the contact face at the light guide and the edge of the spacer opening can thus be partially reduced at the moment at which wedging occurs, whereby a resistance to sliding into the spacer opening can also be reduced.

The at least one guide recess can be formed on a retainer side of the spacer pointing away from the printed circuit board and pointing toward the retaining frame.

The at least one support face and the at least one guide recess may be arranged in succession as considered in the circumferential direction of the bearing opening. In other words, the at least one support face and the at least one guide recess can be provided at the edge of the at least one bearing opening.

The at least one guide recess or some of the guide recesses or all guide recesses may be formed with a predetermined depth. The guide recess therefore is not continuous, but instead is formed in the manner of a blind bore. By contrast, the at least one bearing opening is formed as a through-bore. Since the guide recess is not continuous, the inner wall face of the bearing opening can be formed independently of the guide recess. In an alternative embodiment it is conceivable to form the at least one guide recess or some of the guide recesses or all guide recesses continuously, which enables simpler production.

In a further embodiment a plurality or multiplicity of guide recesses and/or a plurality or multiplicity of support faces are formed circumferentially around the bearing opening. At the time of assembly, the light guide can thus arrive at the spacer at different positions and can be guided into the associated bearing opening.

In a further embodiment the optical unit may include a plurality of light guides, which can be provided in each case for at least one light source. These can then each have a coupling-in face and can be connected on the output side via a common connection portion of the optical unit. The connection portion may then include an outlet face pointing away from the light guides. The spacer then may have a continuous bearing opening in each case for a respective light guide of the optical unit or for at least some of the light guides of the optical unit.

An inlet portion with the coupling-in face may be provided for at least one light guide or for at least some of the light guides. This inlet portion or these inlet portions is/are embodied for example in circular cylindrical or approximately circular cylindrical form. A light guide portion can then adjoin the inlet portion or a corresponding inlet portion, which light guide portion may be widened between the inlet portion and the connection portion, i.e. can constitute a step in the light guide, wherein the light guide portion can then widen in the direction of radiation. In this way, the light guide can "support" itself on the spacer, e.g. on the at least one support face or the plurality of support faces, and the distance between light source and light guide can be adjusted and maintained in a precise manner. A mounting, referencing and positioning in the spacer (e.g. in all three spatial directions) is thus made possible by the inlet portion, wherein free shaping and guidance of the light is then made possible in the light guide portion. Besides the cylindrical or circular cylindrical embodiment, other geometries are also conceivable, for example inlet portions and/or bearing openings with elliptical, rectangular, polygonal, angular or freely shaped cross sections.

In a further embodiment at least some of the guide recesses or all the guide recesses of the at least one bearing opening are distanced from one another, as considered in the circumferential direction. As considered from the bearing opening, the inner lateral face of the bearing opening can then be formed between two distanced guide recesses, whereby the light guide can then be supported at the bearing opening also in the mouth region of the guide recesses. Of course, it is also conceivable for at least some of the guide recesses or all guide recesses to be arranged adjacently to one another as necessary.

In various embodiments at least one guide recess or some of the guide recesses or all guide recesses is/are triangular or zigzag-shaped. As a result of the zigzag-shaped embodiment, effective threading of the light guide is made possible on the one hand, and on the other hand sufficiently large support faces can be provided. The triangular guide recess or each triangular guide recess may point with its corners away from the bearing opening and can open out into the bearing opening for example via a side, e.g. a complete side. The corner or the corners of the triangular guide recess or of each triangular guide recess may be rounded, so as to prevent damage to the light guide at the time of assembly and during operation.

The, e.g. triangular, guide recesses are arranged for example periodically or non-periodically.

In a further embodiment it can be provided that at least one guide recess or some of the guide recesses or all guide recesses is/are formed in a wave shape running around the at least one bearing opening. Due to the wave shape, sharp edges are avoided in a simple way, so as to avoid damage to the light guide. The wave shape for example can be periodic or non-periodic.

In various embodiments it is conceivable that the wave shape of a guide recess or of some of the guide recesses or all guide recesses can be described by a curve that is not differentiable in a mathematical sense. e.g., it can be provided that the wave shape Includes edge transitions or bends, which can be described by one or more non-differentiable mathematical curves. The aforementioned mathematical curve for example can be a one-dimensional or two-dimensional parameterizable curve, which can be represented with the aid of one or two parameters. In the case of a two-dimensional parameterizable curve, the curve is formed as an area.

At least one edge or some of the edges or all edges of the at least one guide recess or of some of the guide recesses or of all guide recesses may be rounded between said recess(es) and the retainer side and/or the bearing opening. The edge or the edges may then be formed in a convex manner, whereby the guide recess or guide recesses is/are at least partially or completely no longer sharp-edged, but formed with rounded portions, e.g. small rounded portions, so as to effectively prevent the spacer, which for example is formed of sheet metal, from cutting into the optical unit, which e.g. is soft and for example is made of silicone.

It may be provided that the guide recesses of at least one bearing opening or some of the bearing openings engage in the guide recesses of at least one adjacent or a respective adjacent bearing opening. It can thus be provided that the guide recesses of adjacent bearing openings engage in one another, but nevertheless can be distanced from one another. Here, it is made possible that the bearing openings can be arranged and formed at a short distance from one another in spite of the guide recesses. It is also conceivable that the guide recesses of at least one bearing opening or some of the bearing openings are distanced from the guide recesses of a further adjacent bearing opening, wherein the adjacent guide recesses can then point toward one another. In various embodiments a guide can be provided in the receiving space for at least one light guide. The at least one light guide, as the optical unit is inserted into the receiving space, can hereby be threaded through the provided guide geometry and oriented. A guide may be provided for some of the light guides or for all of the light guides, whereby simple insertion and orientation of the overall optical unit is made possible. The retaining frame can thus be used not only in order to protect the optical unit and to position the optical unit on the printed circuit board, but additionally may include a threading aid for the optical unit. The guide or each guide can be provided with a simple design in the form of a through-recess on the base side of the receiving space. Furthermore, the guide or each guide can have a guide surface surrounding the lateral surface of the corresponding light guide, wherein the guide surface or each guide surface may be distanced or substantially distanced from the corresponding lateral surface in the state in which the optical unit is inserted in the retaining frame, so as not to negatively influence the optical unit.

The cross section of the guide surface or some of the guide surfaces or each guide surface may be formed with an oversize compared to the corresponding cross section of the associated light guide(s). However, it is conceivable that a protrusion, e.g. a small protrusion, or a plurality of protrusions, e.g. small protrusions, is/are provided on the guide surface or on each guide surface or on some of the guide surfaces, which protrusion/protrusions bears/bear against the light guide after assembly, so as to orientate the corresponding light guide in a predetermined manner. The protrusions for example are punctiform or linear or are embodied in a free-form manner. The provision of the protrusion or of the protrusions, however, can lead to optical losses.

A guide or some of the guides or all guides may include a guide opening, the cross section of which is formed in such a way that the corresponding light guide arrives at the associated bearing opening centrally, to the greatest possible extent, at the time of assembly.

It may be provided that the smallest cross-sectional area of the bearing opening or of some of the bearing openings or each bearing opening is smaller than a smallest cross-sectional area of the guide opening of the associated guide, and the smallest cross-sectional area of the bearing opening then lies within the smallest cross-sectional area of the guide opening, as considered in the direction of the optical main axis of the corresponding radiation source. In other words, the guide surface or some of the guide surfaces or all guide surfaces is/are formed in the retaining frame in such a way that a maximum permissible circumferential air gap or mechanical play (under consideration of the tolerances) remains between the retaining device and the corresponding light guide. This is extremely helpful in order to keep a lateral offset between the light guide and the spacer as small as possible, such that the light guide, at the time of joining, arrives at the bearing opening, and as applicable the associated guide recesses, centrally to the greatest possible extent. Due to the embodiment of the guide surfaces, a certain tolerance is thus permitted in respect of the mounting of the optical unit, and yet reliable assembly is made possible on account of the at least one guide recess.

The light guides may be connected integrally to the connection portion, which enables simple production and assembly. The optical unit with the connection portion and the light guides may consist at least partially, or substantially completely, or completely of silicone, however other transparent materials are also conceivable, such as poly(methyl methacrylate) (PMMA), polycarbonate (PC), glass, or optically thermoplastic materials, e.g. depending on a spacing, a specific form of the optical unit, and a radiation intensity/luminance of the LEDs. The light guides can bend away from the connection portion and can each have a lateral surface for guiding light, whereby no additional casing is necessary, as is conventional for example in the case of light guides for data transmission. The lateral surface in question is therefore for example simply the interface between the material of the optical unit and the surrounding environment (air). The coupling-in faces of the light guides may extend transversely to the main optical axis of the optical unit. It is thus clear, for example if the optical unit is formed from silicone or liquid silicone, that, in combination with the accurately fitting bearing opening in the spacer, which is necessary for a narrow lateral tolerance, assembly without the guide recess could not be implemented consistently without further aids on account of the provided resilience of the optical unit. The guide recesses, e.g. with use of the optical unit made of a comparatively soft material, thus lead to consistent assembly.

In various embodiments a fastening element, e.g. a holding-down device or a clamp, can be provided, by means of which the optical unit can then be securely held on the retaining frame in a simple manner. The optical unit may then be connected to the retaining frame in a frictionally engaged and form-fitting manner via the fastening element. The holding-down device can be formed in a simple manner as a bracket component, which passes over the retaining frame and in so doing retains the optical unit. A bracket component of this kind on the one hand can be easily produced and on the other hand can be easily assembled, since it is simply clamped onto the retaining frame. It is conceivable that the holding-down device has an approximately U-shaped cross section. It can then have a base portion, which bears against the optical unit, and furthermore may include two limbs, which then extend away from the base portion. The holding-down device, by means of the limbs, can then pass over the retaining frame, which for example is block-shaped. The base portion of the holding-down device simply has a recess, through which the optical unit, e.g. the connection portion with the outlet face, is then guided. The limbs of the holding-down device for example each include at least one recess, into which a respective latching lug of the retaining frame can engage in order to fix the holding-down device. Alternatively or additionally, it can be provided that the holding-down device has a latching lug on each of its limbs, which lugs can then engage in a corresponding recess in the retaining frame.

The retaining frame may include at least two latching lugs for each limb, wherein a total of at least four latching lugs can be provided. Each limb may include in each case at least two recesses accordingly, whereby secure fixing of the holding-down device is made possible. The latching lugs or each latching lug can have a ramp, so that the holding-down device can be easily guided by means of its limbs over said ramp.

The optical unit may be surrounded by a retaining flange, e.g. formed in one piece. The optical unit can then be supported easily on the retaining frame by means of said retaining flange. It is then conceivable that the receiving space of the retaining frame is formed in a stepped manner for this purpose, wherein the light guides are arranged in a first small step and the flange portion is then supported in the second, wider step. The holding-down device can then act on the flange face of the retaining flange, which points in the same direction as the outlet face, so as to exert a retaining force onto the optical unit. The light guides and the connection portion therefore are not directly loaded by the retaining force, since this force is exerted onto the retaining flange. Furthermore, there is thus no negative optical influence of the holding-down device, since it merely covers the flange portion, and the optical unit coincidentally is not covered by the holding-down device.

At least one bearing protrusion can be formed on the flange surface of the optical unit, which protrusion may point in a direction away from the retaining frame and thus has a certain spring effect, e.g. so as to counteract an overdefinition. The holding-down device, e.g. the base portion of the holding-down device, can then act on said bearing protrusion(s), so as to clamp the optical unit against the retaining frame. The retaining force is thus introduced via point loading onto the optical unit via the at least one bearing protrusion. A plurality or multiplicity of bearing protrusions of this kind may be provided and for example are distributed circumferentially around the flange surface. The at least one bearing protrusion or the bearing protrusions is/are for example embodied in the form of a truncated cone, wherein they can taper in a direction away from the optical unit. It is also conceivable to provide another geometry and/or another arrangement of the at least one bearing protrusion or the bearing protrusions. The bearing protrusion or the bearing protrusions can be embodied as springs acting at specific points. The optical units can be connected to the retaining frame in a frictionally engaged and form-fitting manner by means of the holding-down device.

The retaining frame furthermore may include a centering lug, which engages in a corresponding centering recess in the holding-down device, so as to prevent an incorrectly oriented or twisted assembly of the holding-down device. The centering lug extends for example simply at the end face of the retaining frame in a direction away from the printed circuit board and can be provided adjacently to the receiving space. The centering recess is for example provided on the base portion and/or on one of the limbs. For example, it can be formed in the region of transition from the base portion to the limb. The centering lug of the retaining frame and the centering recess of the holding-down device can thus be what is known as a "poka-yoke", and therefore a technical precautionary measure or mechanism for preventing errors.

The spacer may be arranged on a connection side of the retaining frame which points away from the outlet face of the optical unit, i.e. is provided opposite the outlet face, and via which the retaining frame can be connected to the printed circuit board. A defined distance between the optical unit and the printed circuit board may be formed by means of the spacer, so that the lighting system has a light pattern with a high efficiency and consistent quality. The spacer may be embodied in such a way that at least one light guide or at least some of the light guides is/are positioned in an exact manner relative to the oppositely arranged light-emitting surfaces of the associated light sources. Furthermore, the spacer can be formed in such a way that the retaining frame and/or the optical unit are/is protected and shielded against light not coupled in, wherein the spacer can then perform the function of a diaphragm. The risk that light not actively contributing to the light distribution will cause undesirable effects in the form of scattered light is thus minimized.

As a result of the continuous bearing opening, the corresponding light guide may be mounted and positioned for example transversely to the optical main axis of the optical unit or transversely to the main direction of irradiation of the light sources. The bearing opening may be adjusted to the corresponding light guide or to the corresponding inlet portion of the light guide. The lateral surface of the inlet portion of a respective light guide and the respective bearing opening can thus have an identical or e.g. approximately identical cross section. These surfaces can therefore be adjusted to one another, so as to enable accurate positioning of the light guides transversely to the direction of irradiation of the light sources. It may further be provided for there to be play between the respective bearing opening and the corresponding light guide. The light guide may be distanced radially from the bearing opening associated therewith.

In a further embodiment the spacer has a base portion e.g. including the at least one bearing opening. A collar pointing away from the optical unit can extend from there, via which collar the spacer is supported on the printed circuit board. The spacer is then arranged at a defined distance from the printed circuit board via the collar. The light sources of the printed circuit board can be provided opposite the base portion.

At least one light guide or at least some of the light guides can have a step, with a step face pointing toward the spacer, at the transition between the inlet portion and the light guide portion. The step face can be formed here in an annular or substantially annular manner and can surround a corresponding light guide, wherein it is conceivable to form the circumference of a step face also in an elliptical, rectangular, trapezoidal or free-form manner. The light guide or each light guide can then be supported on the spacer via the or said step face. By means of the step face or by means of the defined geometry transition face at each individual light guide, insertion only as far as a defined depth can thus be permitted since the step face can bear against the baseplate, e.g. in a flat or planar manner, from a certain insertion depth of the light guide or light guides in the corresponding bearing opening. A further insertion and associated reduction in the spacing between the coupling-in faces and the emitting faces of the light sources is therefore not possible, whereby a minimum spacing is achieved. A reduction of the spacing between light guides and light source on account of a thermal expansion of the light guides, for example if these are made of silicone, can thus also be prevented by the abutment of the step face against the spacer. If the light guides then bear for example against the spacer and there is further thermal expansion, it is thus conceivable that the light guides will experience a minor compression, which is then taken up by the material of the light guides, e.g. by the silicone material, and the geometry. This leads to a shifting of the thermally induced geometry changes into areas less critical from an optical point of view. In other words, a direct resting of the coupling-in faces of the light guides on the light-emitting faces of the light sources can be avoided, even in the event of large thermal expansions, whereby further undefined, changing coupling-in effects and therefore a light distribution that fluctuates over the temperature range are avoided.

The step face may surround the associated light guide completely or substantially completely and furthermore bears against the spacer e.g. completely or substantially completely—e.g. from a certain temperature or within an anticipated temperature range—whereby a constant orientation of the coupling-in face is ensured. If abutment is provided within the anticipated temperature range, it can also be provided that the step face experiences abutment under prestress in the anticipated temperature range. This may have the effect that the light guide is always in abutment and is always arranged at a defined distance from the light source. If, by contrast, the step face were to bear for example only against a single point, the coupling-in face, in the event of thermal expansion of the optical unit, for example could be twisted relative to the point, whereby the orientation of said face could change. An angular position of the coupling-in face relative to the light-emitting face of the associated light source can thus remain constant, e.g. parallel, which may be positive for the efficiency of the optical unit. In combination with the accurate positioning transversely to the main direction of irradiation of the light sources and/or transversely to the main optical axis, the optical unit can thus have an extremely high efficiency. It can thus be determined that the coupling-in faces of the optical unit can be mechanically positioned ideally and uniformly relative to the light-emitting faces over the entire anticipated temperature range.

In a further embodiment the spacer includes a spring, via which said spacer can be supported on the retaining frame and can be acted on by a spring force in the direction of the printed circuit board. Reliable abutment of the spacer against the printed circuit board is hereby ensured, even in the event of temperature fluctuations and resultant changes in the geometry of the components of the lighting system. The spring is formed simply as a spring tongue on the spacer. Two, three, four or more springs or spring tongues may be provided in order to provide a sufficient spring force. The springs may be arranged in a distributed manner on the spacer in order to act thereon uniformly with the spring force. In other words, the spring tongues formed on the spacer ensure a uniform and vibration-proof abutment on the printed circuit board surface over the entire anticipated temperature range.

The spacer may be formed economically as a deep-drawn part. It is also conceivable to form the retaining frame as a cast part, e.g. as a plastics injection-molded part. The spacer can then form an insert part, whereby an inlay-molding method can be made possible, which leads to a simplified assembly. Alternatively, it is conceivable to form the spacer in one piece or in one part with the retaining frame, or to combine them. Here, a material that has sufficient resistance to a provided irradiation intensity may be provided for the spacer and the retaining frame. Alternatively, the relevant regions of the used material can be protected via a radiation-resistant coating or metallization.

The spacer is e.g. formed in such a way that the coupling-in faces of the light guides are distanced from the light sources in the relevant or anticipated temperature range, e.g. between −40° Celsius to +125° Celsius.

The printed circuit board may have a plurality of light sources in the form of light-emitting diodes (LEDs). An LED can be present in the form of at least one individually housed LED or in the form of at least one LED chip including one or more light-emitting diodes. A plurality of LED chips can be mounted on a common substrate ("submount") and can form an LED or can be fastened individually or jointly for example to a board (for example FR4, metal core board, etc.) ("CoB"=Chip on Board). The at least one LED can be equipped with at least one separate and/or common optical unit for beam guidance, for example with at least one Fresnel lens or a collimator. Instead of, or additionally to inorganic LEDs, for example based on AlInGaN or InGaN or AlInGaP, organic LEDs (OLEDs, for example polymer OLEDs) can also be used in general. The LED chips can be directly emitting or may include an upstream phosphor. Alternatively, the light-emitting component can be a laser diode or a laser diode arrangement. It is also conceivable to provide an OLED lighting layer or a plurality of OLED lighting layers or an OLED lighting region. The emission wavelengths of the light-emitting components can lie in the ultra-violet, visible or infrared spectral range. The light-emitting components can additionally be equipped with their own converter. The LED chips may emit white light in the standard ECE white area in the automotive industry, for example realized by a blue emitter and a yellow/green converter. The LEDs can be arranged on a board face of the printed circuit board pointing toward the optical unit. The LEDs of the printed circuit board may be arranged in a matrix-like manner, wherein each light guide can be assigned a respective LED. It is also conceivable, however, that a plurality of LEDs are assigned to one light guide. The printed circuit board is for example a metal core printed circuit board (MCPCB) or a printed circuit board having a thermally conductive core (what is known as an "inlay"), for example what is known as an FR4 printed circuit board with copper core or a core made of another material, or printed circuit boards which are produced entirely from other materials, such as aluminum nitride (AlN). In addition, electronic components and parts can be provided on the printed circuit board.

In a further embodiment it can be provided that the step faces of the light guides bear against the spacer at a specific temperature, e.g. at a room temperature, and the light guides are additionally acted on by a clamping force. If the temperature decreases, the light guides thus continue to bear against the spacer. In other words, e.g. when the lighting system is used in a vehicle, and with an anticipated low minus temperature in combination with the coefficient of thermal expansion of the optical unit, which e.g. is made of silicone, it can be provided to design the optical unit with a defined oversize. This means e.g. that the step faces at a specific temperature, e.g. at the room temperature, bear against the spacer with pressure. It is thus ensured that, in the event of a shrinkage of the optical unit caused by cold conditions, there is no increase in the spacing between the coupling-in faces of the light guides and the light-emitting faces of the light sources. In the case of silicone, this shrinkage is comparatively great. Alternatively, it can be provided that at a specific temperature, e.g. at a room temperature, the step faces of the light guides bear against the spacer and the light guides are acted on by a low clamping force or no clamping force. The magnitude of the clamping force is e.g. such that at lower temperatures, at which the LEDs are typically lighter, the spacing between the LEDs and the light guides is increased, whereby in turn the optical unit becomes less efficient. These effects hereby cancel one another out, and the resultant light flux remains approximately constant.

In various embodiments at least one reference geometry is provided on the retaining frame or on the printed circuit board. This may penetrate a reference recess, e.g. a continuous reference recess, of the spacer. Furthermore, the reference geometry can be inserted into a reference recess of the printed circuit board or of the retaining frame, depending on whether it is formed on the retaining frame or on the printed circuit board. On account of the reference geometry, a tolerance chain is thus significantly reduced. Due to the reference geometry, the retaining frame with the optical unit inserted therein and the spacer can be positioned and referenced with respect to the printed circuit board with its individual light sources. By way of example, a positioning transversely to the main optical axis and/or transversely to the main direction of irradiation of the light sources, e.g. in the X-Y plane, can thus be implemented via the reference geometry. The optical unit is then easily referenced via the spacer. The reference geometry may be inserted into the printed circuit board or the retaining frame via a plug-in assembly.

In a further embodiment the reference geometry may be formed as a reference protrusion, e.g. a cylindrical reference protrusion. Other geometries, for example triangular, square, hexagonal, polygonal, oval or free form, are also possible. It can extend away from the retaining frame, e.g. parallel to the main optical axis of the optical unit and/or to the main direction of irradiation of the light sources. Alternatively, the reference protrusion can also extend away from the printed circuit board. A reference protrusion of this kind can be easily produced. The reference recess in the spacer is for example designed simply as a bore, which can be formed with narrow tolerances. In order to receive the reference protrusion, the printed circuit board or the retaining frame may likewise include a bore of simple design, which can be formed with narrow tolerances. The reference geometry can thus penetrate the narrowly tolerated bores in the spacer and the printed circuit board or the retaining frame, whereby the tolerance chain is significantly reduced. Two parallel reference protrusions may be provided, which each penetrate a corresponding reference recess in the spacer and are each inserted into a corresponding reference recess in the printed circuit board or in the retaining frame. The light guides may be guided through the spacer between the reference recesses therein.

In other words, both the printed circuit board and the spacer can be referenced on the basis of the same reference, specifically the retaining frame, for example instead of referencing the retaining frame relative to the spacer and the spacer relative to the printed circuit board. The tolerance chain created by the individual components is thus minimized on account of the use of reference geometries.

Since, on account of the referencing, a position correction between the spacer and the retaining frame, for example by lateral displacement, is prevented, it may be provided if the at least one guide recess is provided, since such a position correction is unnecessary hereby.

The retaining frame in a further embodiment may include, on its connection side pointing toward the printed circuit board, a plurality of bearing protrusions, e.g. arranged at corners. Depending on the size and arrangement option, merely two or three bearing protrusions can also be provided, instead of four (or more). By means of said protrusions, the retaining frame can bear against the printed circuit board and furthermore can be fastened to the printed circuit board via said protrusions by fastening means, for example screws, bolts or other suitable fasteners.

The components of the lighting system, e.g. the optical unit, the spacer and the printed circuit board, may be fixed in a simple manner to the retaining frame and oriented in a precise manner relative to one another.

In various embodiments, a headlamp or a headlamp module including a lighting system according to one or more of the above aspects is provided. The optical unit is then a primary optical unit, for example. In addition, at least one secondary optical unit can be provided, which is arranged downstream of the primary optical unit.

The headlamp may be provided in a vehicle. High temperature fluctuations can occur in the vehicle, which, due to the headlamp according to various embodiments, have no influence or hardly any influence on the efficiency and quality of the projected light pattern. The lighting system in the headlamp can be used for example for a high beam or auxiliary high beam or dipped beam, for example for an advanced front lighting system (AFS) or an adaptive driving beam (ADB).

Furthermore, it can be provided that the headlamp is designed as a matrix headlamp. It can thus satisfy all functions of an adaptive high beam. For example, any individual light source or group of light sources in the form of one/a plurality of LED(s) in the lighting system, which can be embodied as a module, can then be separately controlled and thus switched on and off and dimmed. In combination with a camera system and an image-processing electronics unit and/or other sensor system, oncoming traffic and vehicles traveling ahead can be identified and masked out in regions. With an accordingly high number of pixels, it is additionally conceivable to separately illuminate objects identified via the camera system, such as pedestrians, animals or obstacles, and therefore to make the driver aware of them.

The vehicle can be an aircraft or a water-based vehicle or a land-based vehicle. The land-based vehicle can be a motor vehicle or a rail vehicle or a bicycle. The use of the vehicle headlamp in a heavy goods vehicle or passenger vehicle or motorbike may be provided. The vehicle can furthermore be embodied as an autonomous or semi-autonomous vehicle.

Further fields of application can be, for example, headlamps for effect lighting, entertainment lighting, architainment lighting, general lighting, medical and therapeutic lighting, horticulture, etc.

In accordance with various embodiments a method for producing a lighting system according to one or more of the above aspects is provided and includes the following:

Connecting and/or joining the retaining frame to the spacer. Connection to the printed circuit board can be provided additionally as required.

Inserting or joining the optical unit in the retaining frame and the spacer.

This solution may have the effect that at least the retaining frame and the spacer can be assembled beforehand, and the optical unit then inserted. On account of the guide recesses, the at least one light guide then slides reliably into the corresponding bearing opening, whereby there is no need for access, for example from outside, in order to make corrections. A pre-assembly at least of the retaining frame and the spacer can therefore be made possible. Once inserted, the optical unit may be fixed in position on the retaining frame via the fastening means.

It is also conceivable that the optical unit is firstly inserted into the retaining frame and then the spacer is attached.

Figure 1:
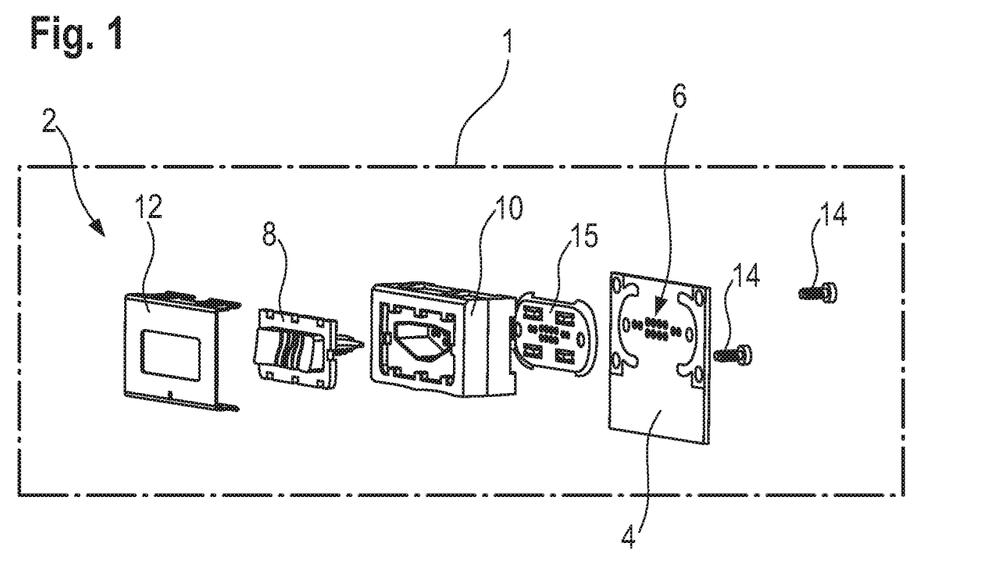
FIG. 1 shows in an exploded illustration, a lighting system according various embodiments.

According to FIG. 1 a headlamp 1 is shown in simplified form by a dashed line, which headlamp includes a lighting system 2. This system has a printed circuit board 4 with a multiplicity of light sources arranged in a matrix-like manner in the form of light-emitting diodes (LEDs) 6. The lighting system 2 further includes an optical unit 8, which is fastened to the printed circuit board 4 via a retaining frame 10. The optical unit 8 is secured to the retaining frame 10 via a clamp-like holding-down device 12. The retaining frame 10 is fixed to the printed circuit board 4 via fastening elements in the form of screws 14. Furthermore, a spacer 15 is arranged between the printed circuit board 4 and the retaining frame 10 so as to position the optical unit 8 accurately. In addition, a secondary optical unit (not shown) is part of the headlamp 1 or the lighting system 2.

Figure 2:
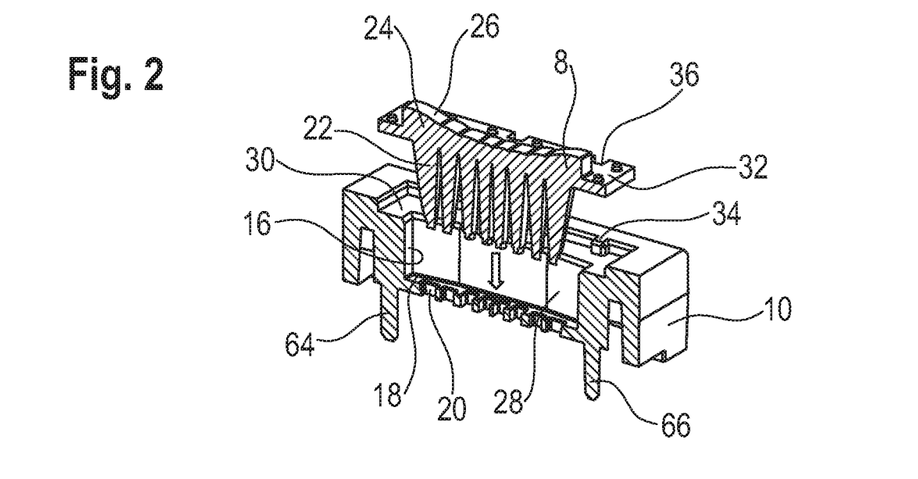
FIG. 2 shows in a perspective sectional view, a retaining frame with an optical unit of the lighting system.

According to FIG. 2 the retaining frame 10 includes a receiving space 16 for the optical unit 8, said space pointing away from the printed circuit board 4. The receiving space 16 has a base side 18, in which multiple through-recesses 20 are provided in the form of guides. Light guides 22 of the optical unit 8 can be guided through said recesses. The light guides 22 of the optical unit 8 extend from a common connection portion 24 of the optical unit 8 approximately parallel to the main optical axis of the optical unit. The connection portion 24 has an outlet face 26 on its side pointing away from the light guides 22 and the retaining frame 10. Each of the light guides 22 is assigned its own LED 6 (see FIG. 1), which LEDs can then couple light into the optical unit via the light guides 22. The light emitted by the LEDs 6 can then be approximated via the light guides 22. Dark regions between light paths of a particular LED 6 can hereby be avoided by overlapping the light paths at their edges with the connection portion 24.

The receiving space 16 is formed in a stepped manner and has a first step (or alternatively called first process) 28, which extends from the base side 18, and a widened second step 30 adjoining the first step 28. The first step 28 is used to receive the light guides 22 and the second step (or alternatively called second process) 30 is used to receive a retaining flange 32, which is formed on the optical unit 8, surrounds the optical unit 8 and is formed integrally therewith. A plurality of springs 34 is formed in the second step 30, said springs engaging in corresponding grooves 36 in the retaining flange 32. An incorrectly oriented insertion of the optical unit 8 can hereby be avoided. In the state in which the optical unit 8 is inserted into the retaining frame 10, the retaining flange 32 is then received in the second step 30, and the light guides 22 are guided through the through-recesses 20.

Figure 3:
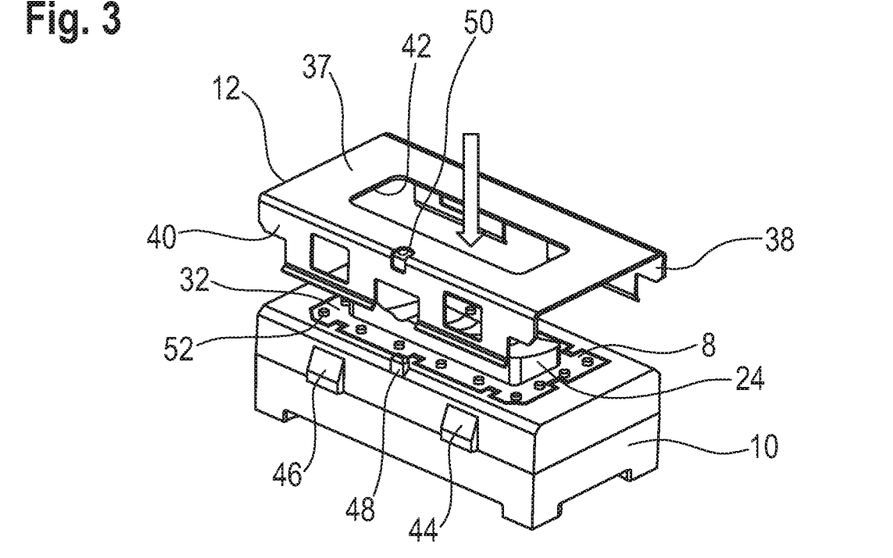
FIG. 3 shows in a perspective illustration, the retaining frame with the optical unit and a holding-down device.

According to FIG. 3 the holding-down device 12 is shown, by means of which the optical unit 8 is fixed to the block-shaped retaining frame 10. The holding-down device 12, which is approximately U-shaped as considered in cross section, is formed as a bracket part and has a base portion 37 from which a first and second limb 38 and 40 extend, these being arranged approximately in parallel at a distance from one another. A recess 42 is formed centrally on the base portion 37, through which recess the connection portion 24 of the optical unit 8 is guided. The limbs 38 and 40 then pass over the block-shaped retaining frame 10 laterally and in each case latch with in each case two latching lugs 44, 46 formed on the retaining frame 10.

A centering lug 48 is also provided on the retaining frame 10. This lug is formed flush with a side face of the retaining frame which is passed over by the limb 40. The centering lug 48 then extends approximately parallel to the main optical axis and protrudes from the rest of the retaining frame 10 in a direction away from the printed circuit board 4 (see FIG. 2). The centering lug 48 cooperates here with a centering recess 50 in the holding-down device 12, whereby the holding-down device 12 can be arranged only in one possible position on the retaining frame 10, whereby incorrect assembly is avoided.

In accordance with FIG. 3, multiple bearing protrusions 52 are also formed on the retaining flange 32. These protrusions are distributed circumferentially around the connection portion 24 of the optical unit 8. At least if the holding-down device 12 is not placed on the retaining frame 10, these bearing protrusions protrude from the receiving space 16 (see also FIG. 2). If the holding-down device 12 is then placed on the retaining frame 10, said holding-down device thus bears with its base portion 37 against the bearing protrusions 52 and thus exerts a retaining force onto the retaining flange 32 via said protrusions. The optical unit 8 is then firmly clamped via the retaining flange 32 between the holding-down device 12 and the second step 30 (see also FIG. 2). The retaining force can be introduced into the retaining flange 32 in a defined manner via the bearing protrusions 52.

Figure 4:
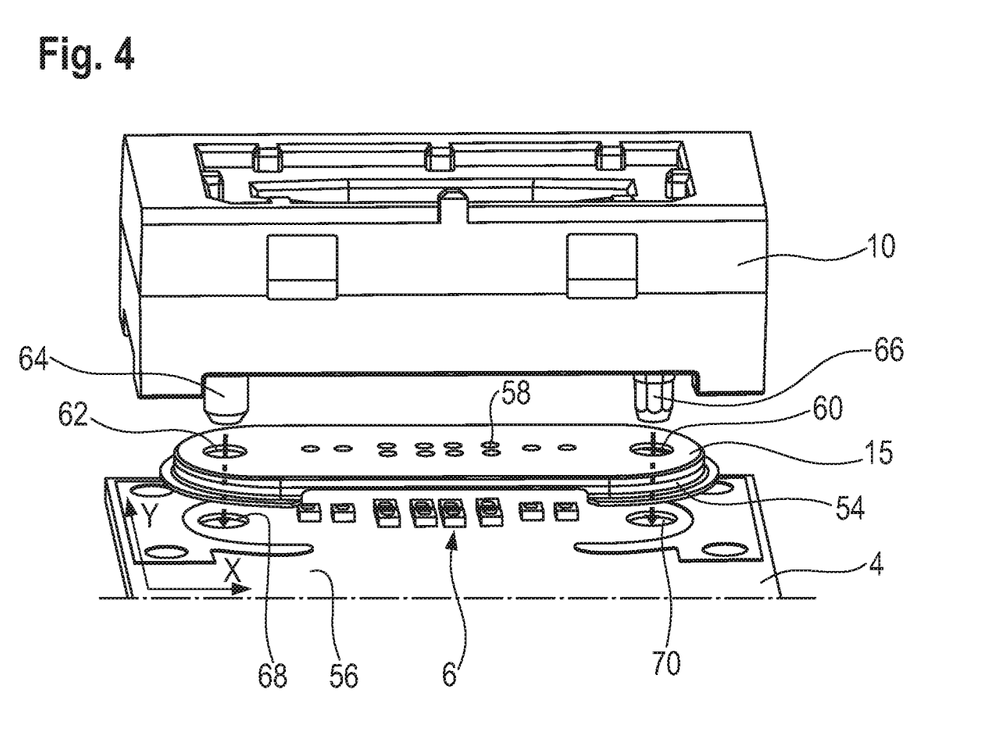
FIG. 4 shows in a perspective exploded illustration, the retaining frame, a simplified illustration of the spacer (without guide recesses or springs), and a printed circuit board.

According to FIG. 4, besides the retaining frame 10 and the printed circuit board 4, the spacer 15 arranged in between is also shown. The approximately planar spacer 15 has a collar 54 formed peripherally in part on the side of said spacer pointing toward the printed circuit board 4. The spacer 15 in the installed state bears via said collar against a board face 56 of the printed circuit board 4 pointing toward the retaining frame 10. Since the lacquer coating in some circumstances is subject to greater variations in coating thickness, due to tolerances (Z-orientation) merely the uncoated regions of the board face 56 intended for this purpose are used as contact faces for the spacer 15 and the retaining frame 10. The LEDs 6 are then arranged on the printed circuit board 4. The spacer 15 then lies above the LEDs 6 and is thus arranged between said LEDs and the retaining frame 10. The LEDs 6 are also arranged within the collar 54.

For a corresponding light guide 22 (see FIG. 2), the spacer 15 has bearing openings 58, which will be explained in greater detail further below. Furthermore, the spacer 15 has two reference recesses 60 and 62 laterally, e.g. in the form of bores that are continuous. These are each penetrated in the assembled state by reference geometries in the form of reference protrusions 64 and 66 of the retaining frame 10. These extend in accordance with FIG. 2 laterally to the through-recesses 20 in parallel and at a distance from the main optical axis. According to FIG. 4 two reference recesses 68, 70 are then also formed in the printed circuit board 4 for the reference protrusions 64 and 66, into which reference recesses the reference protrusions 64 and 66 are then inserted in the assembled state. The spacer 15 and the printed circuit board 4 are thus referenced and positioned independently of one another relative to the retaining frame 10, e.g. laterally or in the X- and Y-direction via the reference protrusions 64 and 66.

Figure 5A:
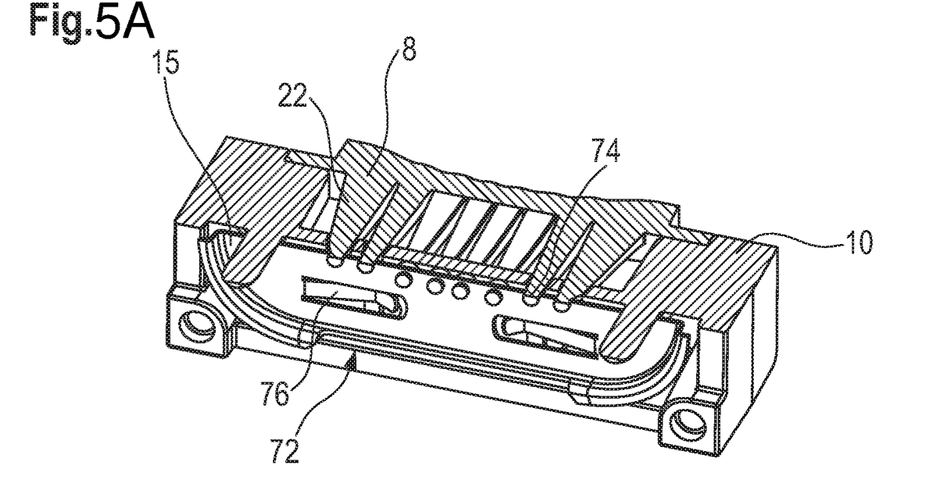
FIGS. 5A to 5D show in various views, parts of the lighting system, e.g. in the region of the spacer, which is shown without guide recesses, wherein in FIG. 5C no spacer has been shown for the purpose of improved presentability.

According to FIG. 5A a connection side 72 of the retaining frame 10 is shown in a perspective sectional view, said connection side pointing toward the printed circuit board 4 (see FIG. 1, for example). Furthermore, the spacer 15 and the optical unit 8 are visible. It can be seen that the light guides 22 are each inserted by means of an inlet portion 74 arranged at the end into a respective bearing opening 58 (see also FIG. 4) in the spacer 15 and penetrate same. The spacer 15 according to FIG. 5A has spring tongues 76, wherein two of four spring tongues 76 are shown in the sectional view according to FIG. 5A. For the sake of simplicity, these are not shown in FIG. 4 (sectional illustration). The spring tongues 76 each extend toward the retaining frame 10 and are supported thereon. In the assembled state, they then act on the spacer 15 with a spring force in the direction of the printed circuit board 4 (see FIG. 4), whereby an abutment of the spacer 15 on the printed circuit board 4 is ensured, even at different temperatures and thus different expansions, for example of the retaining frame 10.

Figure 5B:
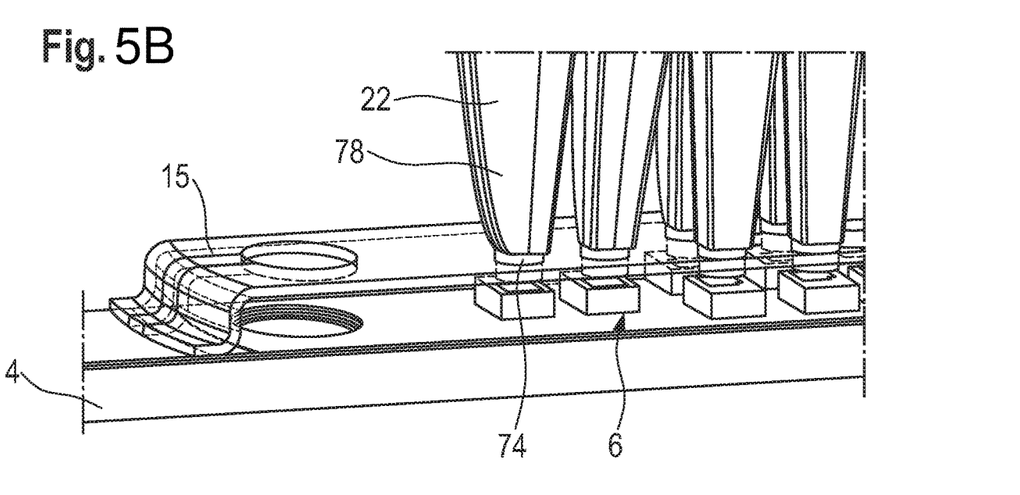

According to FIG. 5B, the printed circuit board 4, the spacer 15 and the light guides 22 are shown in a perspective view and in detail. It can be seen that the inlet portions 74 of the light guides 22 arranged at the end have a circular cylindrical cross section. On their side pointing toward the LEDs 6, the inlet portions 74 then each have a coupling-in face. A light guide portion 78 adjoins each inlet portion 74 via a step.

Figure 5C:
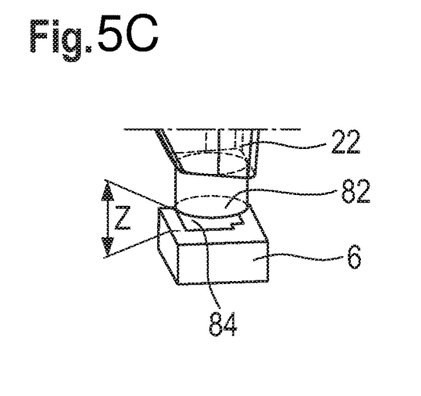
Figure 5D:
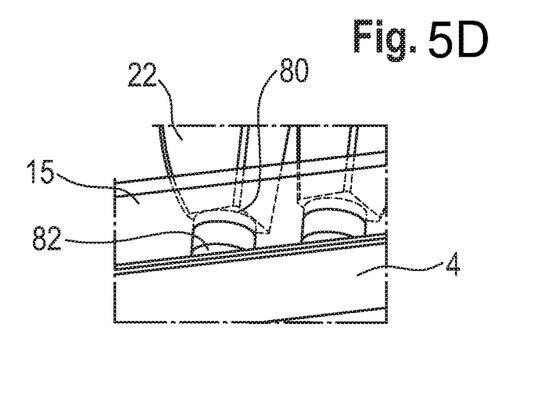

According to FIG. 5B, each light guide 22 on account of the step then has an annular step face 80, wherein in FIG. 5D a portion of the spacer 15, the printed circuit board 4, and the light guides 22 is shown in a perspective illustration. Each light guide 22 can be supported on the spacer 15 via the step face 80, as shown in accordance with FIG. 5B, whereby an insertion depth of the inlet portions 74 is limited. A minimum distance between the LEDs 6 and the coupling-in faces of the light guides 22 can thus be achieved. The coupling-in faces are shown in FIG. 5D with the reference sign 82.

According to FIG. 5C a distance in the Z-direction, i.e. in a direction parallel to the main optical axis of the optical unit 8 from FIG. 1, is shown between a light-emitting face 84 of an LED 6 and the coupling-in face 82 of a light guide 22.

Figure 6:
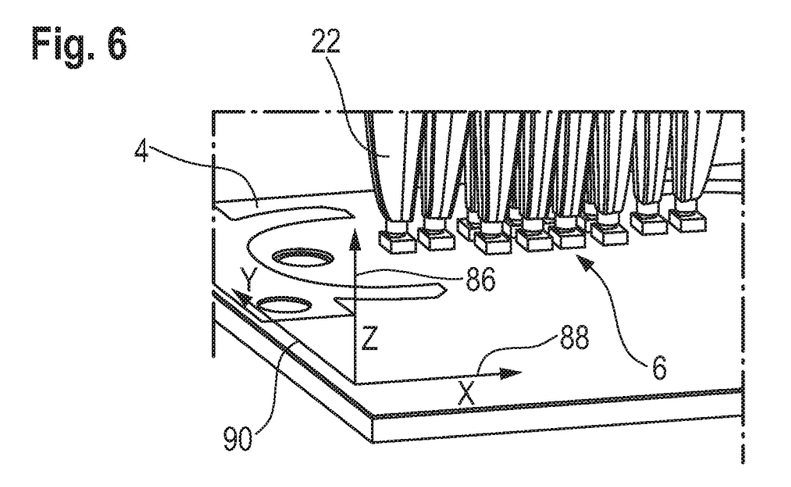
FIG. 6 shows in a perspective illustration, components of the lighting system with the spatial axes referenced.

According to FIG. 6 the printed circuit board 4 and the light guides 22 are shown in a perspective illustration. Furthermore, the Z-direction 86, an X-direction 88 and a Y-direction 90 are shown. As already explained above, the Z-direction is the direction of the main optical axis of the optical unit 8 and/or a main direction of irradiation of the LEDs 6. In the installed state of the headlamp 1 (see FIG. 1) in a vehicle, the Z-direction can extend alternatively or additionally parallel to the vehicle longitudinal axis. The X-direction 88 can then extend horizontally, and the Y-direction 90 can extend vertically. According to FIG. 6 the X-direction 88 and the Y-direction 90 are provided in a plane extending parallel to the printed circuit board 4.

Figure 7:
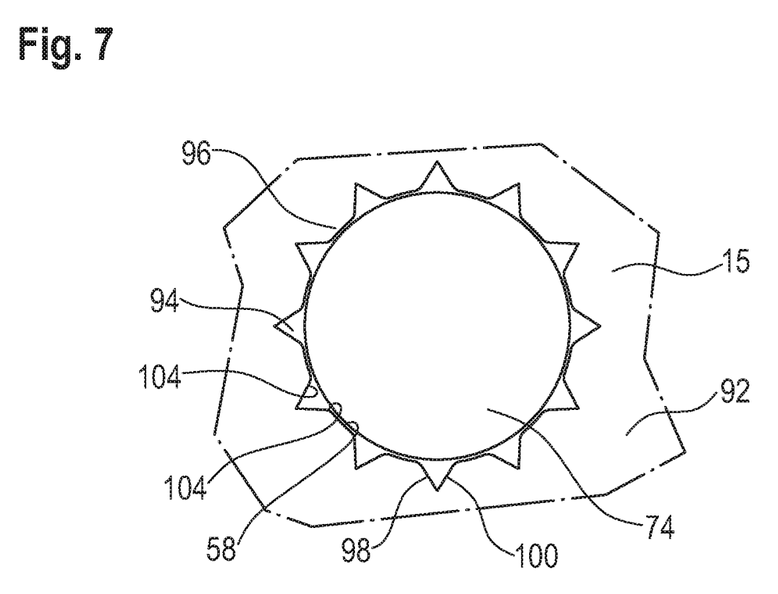
FIG. 7 shows in a cross-section, a detail of the spacer in the region of a bearing opening with installed optical unit (inlet portion)

FIG. 7 shows a detail of the spacer 15 in the region of the bearing opening 58 with positioned inlet portion 74 of the optical unit 8. Here, the upper retainer side 92 of the spacer 15 is visible, e.g. pointing in the direction of the retaining frame 10 (see for example FIG. 4). It can be seen that a multiplicity of zigzag-shaped guide recesses 94 are formed on the edge of the bearing opening 58, wherein only one of said recesses has been provided with a reference sign for reasons of simplicity. The triangular guide recesses 94 are arranged with their tip in each case pointing away from the bearing opening 58 approximately radially. Multiple support faces 96 are formed between the guide recesses 94, wherein only one of said support faces has been provided with a reference sign for the sake of simplicity. The support faces 96 easily form a part or portion of the approximately flat spacer surface. The guide recesses 94 and the support faces 96 are thus formed circumferentially in alternation in the edge of the bearing opening 58. A corresponding guide recess for example has two edges 98, 100 arranged in a V shape and converging in a direction away from the bearing opening 58. The edges 98, 100, corner regions 104, and the bearing opening 58 are burr-free/rounded as considered from the retainer side 92, so as to avoid damaging the light guides 22. Furthermore, the regions 104 facing toward the optical unit in the joined state and the bearing opening 58 do not have any sharp edges.

The guide recesses 94 can be arranged with a different spacing as considered in the circumferential direction of the bearing opening 58. It is also conceivable to distribute said recesses uniformly over a pitch circle, as is shown in FIG. 7.

Figure 8A:
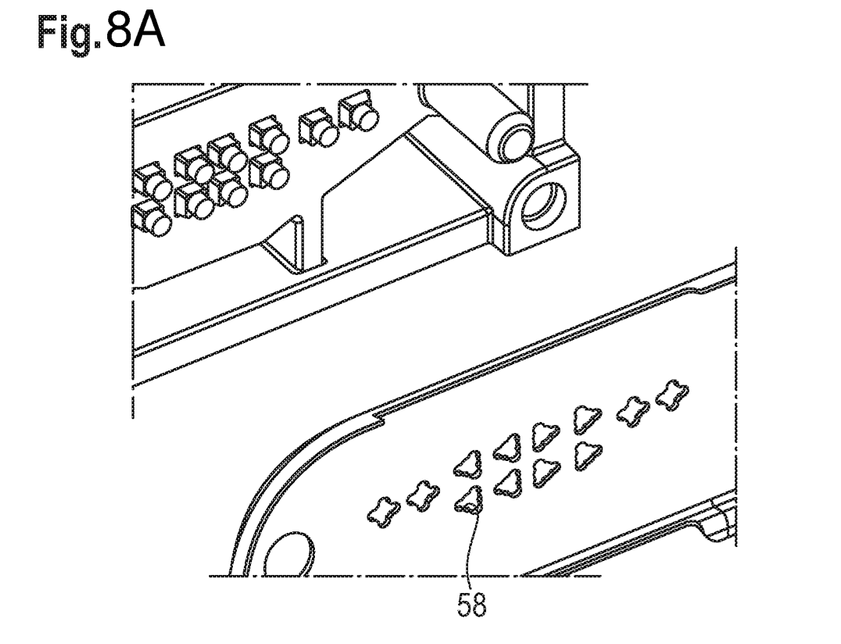
FIGS. 8A and 8B show, in each case in a perspective illustration, a detail of the spacer with bearing openings and exemplary design of guide recesses.
Figure 8B:
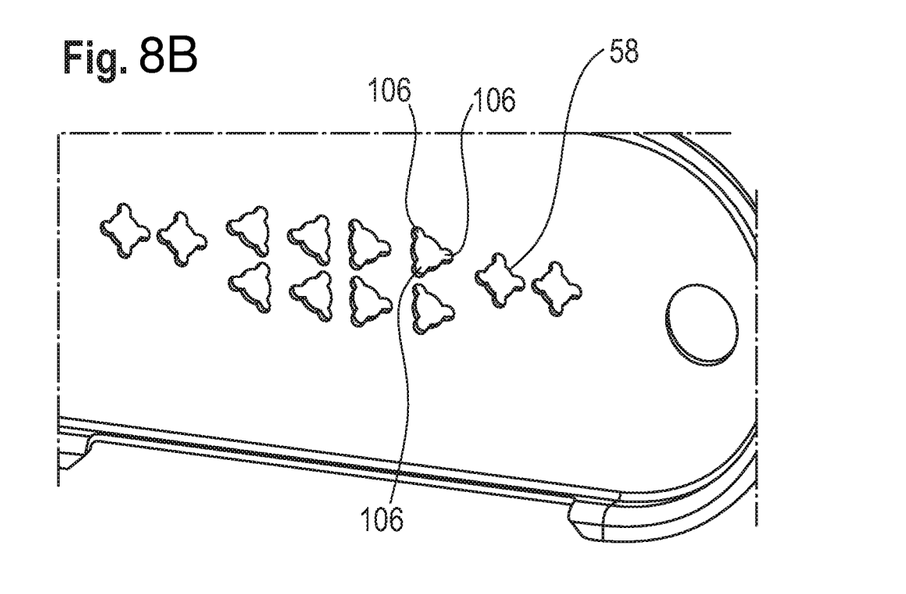

According to FIG. 8A and FIG. 8B, it can be seen that guide recesses 106 have a round or curved inner lateral surface, wherein they can extend at least in part along a circular arc. Here, three guide recesses 106 are provided in the central bearing openings 58, whereas four are provided in the bearing openings arranged at the edges. The guide recesses 106 at a respective bearing opening 58 are arranged over a pitch circle.

The assembly of the lighting system 2 will be explained hereinafter. According to FIG. 4, the retaining frame 10 is firstly joined to the spacer 15 and the printed circuit board 4, these parts being connected to one another. The joining is performed here in the z-direction 86 (see FIG. 6). The optical unit 8 (see FIG. 2, for example) can then firstly be introduced into the retaining frame 10 in the z-direction 86. The light guides 22 here are inserted into the through-recesses 20 and are guided thereby toward the bearing openings 58 of the spacer 15 (see FIG. 4). Here, a comparatively small protrusion can be provided in a through-recess 20 or in some of the through-recesses 20 or in each through-recess 20, in order to improve the guidance of the light guides 22 at the time of assembly. An opening cross section of a respective through-recess 20 is selected here in such a way that a corresponding light guide 22 at least reaches the guide recesses 94 (see FIG. 7) of the bearing opening 58 assigned to said light guide. The corresponding light guide 22, if it is not inserted directly into the bearing opening 58, can then be guided by the guide recesses 94 toward the bearing opening 58. The optical unit 8 from FIG. 2 can thus be guided initially with its light guides 22 by the through-recesses 20, and the light guides 22 can then be inserted into the corresponding bearing opening 58 and as necessary can be guided via the corresponding guide recesses 94 into the bearing openings 58. The optical unit 8 is then fixed via the holding-down device 12 in accordance with FIG. 3. As necessary, a respective light guide 22 can be supported on the support faces 96 of the bearing opening 58 thereof (see FIG. 7) via a step face 80 thereof (see FIG. 5D).

It can thus be determined that the holding-down device 12 (see FIG. 1) is used to fix the optical unit 8 in the retaining frame 10. The optical unit 8 formed from silicone is designed for light shaping, e.g. by means of its light guides 22 (see FIG. 2). The retaining frame 10 (see FIG. 1) is used to position and fix all components relative to one another with the aid of a reference geometry and is also used as a threading aid for the optical unit 8. The spacer 15 is provided for exact positioning of the light guides 22 relative to the light-emitting face 84 (see FIG. 5C) in the x-, y- and z-directions, and also for shielding the retaining frame 10 against radiation.

Disclosed is a lighting system including an optical unit including a light guide. This optical unit can be fastened via a retaining frame to a printed circuit board. A spacer can be arranged between the optical unit and the printed circuit board in order to position the at least one light guide in an exact manner relative to a light source provided on the printed circuit board. The plate-like spacer has a bearing opening for the positioning of the light guide, into which opening the light guide is introduced. The bearing opening includes, on its edge region, at least one guide recess and at least one support face pointing toward the retaining frame. If the light guide reaches the edge region of the bearing opening, said light guide can then be guided toward the bearing opening via the guide recess during assembly. The light guide can be supported as necessary over its lateral surface via the support face.

LIST OF REFERENCE SIGNS headlamp 1
lighting system 2
printed circuit board 4
LED 6
optical unit 8
retaining frame 10
holding-down device 12
screws 14
spacer 15
receiving space 16
base side 18
through-recess 20
light guide 22
connection portion 24
outlet face 26
step 28, 30
retaining flange 32
spring 34
groove 36
base portion 37
limb 38
limb 40
recess 42
latching lug 44, 46
centering lug 48
holding-down device 50
bearing protrusions 52
collar 54
board face 56
bearing opening 58
reference recess 60, 62, 68, 70
reference protrusion 64, 66
connection side 72
inlet portion 74
spring tongue 76
light guide portion 78
step face 80
coupling-in face 82
light-emitting face 84
z-direction 86
x-direction 88
y-direction 90
retainer side 92
guide recess 94; 106
support face 96
edge 98, 100
corner region 104

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A lighting system, comprising:
an optical unit, which comprises at least one light guide, which is provided for at least one light source;
a retaining frame for the optical unit, said frame fastening the optical unit to a printed circuit board comprising the at least one light source; and
a spacer for positioning the optical unit, which spacer is arranged between the retaining frame and the printed circuit board, the spacer having at least one bearing opening configured to receive the at least one light guide, the bearing opening having an inwardly facing circumferential inner edge surrounding a center of the bearing opening;
wherein a plurality of guide recesses is formed on the edge of the at least one bearing opening and at least one support face is provided on the edge between an adjacent pair of the plurality of guide recesses, the support face supporting the light guide introduced into the bearing opening, the guide recesses extending laterally radially away from the center of the bearing opening;
wherein the guide recesses of at least one bearing opening engage in the guide recesses of at least one adjacent bearing opening; and
wherein the adjacent guide recesses of the adjacent bearing openings point towards one another.

2. The lighting system of claim 1,
wherein a plurality of support faces are formed disposed around the bearing opening.

3. The lighting system of claim 1,
wherein the optical unit has a plurality of light guides, which are each provided for at least one light source and which each have a coupling-in face; and
wherein the light guides are connected on the outlet side via a common connection portion of the optical unit, which has an outlet face pointing away from the light guides.

4. The lighting system of claim 1,
wherein a face pointing toward the spacer is formed on the at least one light guide, via which face the light guide can be supported on the spacer.

5. The lighting system of claim 1,
wherein at least some of the guide recesses are distanced from one another as considered in the circumferential direction.

6. The lighting system of claim 1,
wherein at least some of the guide recesses are triangular or extend in part along a circular arc.

7. The lighting system of claim 6,
wherein each guide recess points with its corner region(s) or circular arc-shaped region away from the bearing opening and leads via one side into the bearing opening.

8. The lighting system of claim 1,
wherein at least some of the guide recesses are formed disposed around the at least one bearing opening.

9. The lighting system of claim 8,
wherein at least some of the guide recesses are waveshaped; and
wherein the wave shape can be described in the mathematical sense.

10. The lighting system of claim 9,
wherein the wave shape can be described in the mathematical sense by one or more non-differentiable curves.

11. The lighting system of claim 1,
wherein some of the guide recesses or all guide recesses are arranged periodically or non-periodically.

12. The lighting system of claim 1,
wherein at least one edge of at least some of the guide recesses is rounded.

13. The lighting system of claim 1,
wherein the guide recesses of at least one bearing opening are distanced from the guide recesses of a further adjacent bearing opening;
wherein the adjacent guide recesses of the adjacent bearing openings point towards one another.

14. The lighting system of claim 1,
wherein, as considered in the direction of the longitudinal axis of the at least one bearing opening, the bearing opening lies within an associated guide opening of the retaining frame.

15. The lighting system of claim 1, wherein the retaining frame (10) defines a plurality of through-recesses (20), each through-recess (20) configured to receive a respective light inlet portion (74) of the at least one light guide (22), the plurality of through-recesses (20) spaced vertically above and in register with a respective said guide recess (94) of the plurality of guide recesses (94).

16. A headlamp, comprising:
a lighting system, comprising:
an optical unit, which comprises at least one light guide, which is provided for at least one light source;
a retaining frame for the optical unit, said frame fastening the optical unit to a printed circuit board comprising the at least one light source; and
a spacer for positioning the optical unit, which spacer is arranged between the retaining frame and the printed circuit board, the spacer having at least one bearing opening configured to receive the at least one light guide, the bearing opening having an inwardly facing circumferential inner edge surrounding a center of the bearing opening;
wherein a plurality of guide recesses is formed on the edge of the at least one bearing opening and at least one support face is provided on the edge between an adjacent pair of the plurality of guide recesses, the support face supporting the light guide introduced into the bearing opening, the guide recesses extending laterally radially away from the center of the bearing opening; and
a spring (76) disposed between the retaining frame (10) and the spacer (15) and configured to bias the spacer (15) towards the printed circuit board (4) without biasing the optical unit (8).

17. The headlamp of claim 16, wherein the retaining frame (10) defines a plurality of through-recesses (20), each through-recess (20) configured to receive a respective light inlet portion (74) of the at least one light guide (22), the plurality of through-recesses (20) spaced vertically above and in register with a respective said guide recess (94) of the plurality of guide recesses (94).

18. A method for producing a lighting system,
the lighting system comprising:
an optical unit, which comprises at least one light guide, which is provided for at least one light source;
a retaining frame for the optical unit, said frame fastening the optical unit to a printed circuit board comprising the at least one light source; and
a spacer for positioning the optical unit, which spacer is arranged between the retaining frame and the printed circuit board, the spacer having at least one bearing opening configured to receive the at least one light guide, the bearing opening having an inwardly facing circumferential inner edge surrounding a center of the bearing opening;
wherein a plurality of guide recesses is formed on the edge of the at least one bearing opening and at least one support face is provided on the edge between an adjacent pair of the plurality of guide recesses, the support face supporting the light guide introduced into the bearing opening, the guide recesses extending laterally radially away from the center of the bearing opening;
further comprising:
connecting the retaining frame to the spacer; and
inserting the optical unit into the retaining frame and the spacer; and
disposing a spring (76) between the retaining frame (10) and the spacer (15); and biasing the spacer (15) towards the printed circuit board (4) without biasing the optical unit (8).

19. The method of claim 18, wherein the retaining frame (10) defines a plurality of through-recesses (20), each through-recess (20) configured to receive a respective light inlet portion (74) of the at least one light guide (22), the plurality of through-recesses (20) spaced vertically above and in register with a respective said guide recess (94) of the plurality of guide recesses (94),
thereby guiding each said inlet portion (74) of a respective said light guide (22) at spaced locations along a longitudinal axis.

20. A lighting system, comprising
an optical unit, which comprises at least one light guide, which is provided for at least one light source;
a retaining frame for the optical unit, said frame fastening the optical unit to a printed circuit board comprising the at least one light source; and
a spacer for positioning the optical unit, which spacer is arranged between the retaining frame and the printed circuit board, the spacer having at least one bearing opening configured to receive the at least one light guide, the bearing opening having an inwardly facing circumferential inner edge surrounding a center of the bearing opening;
wherein a plurality of guide recesses is formed on the edge of the at least one bearing opening and at least one support face is provided on the edge between an adjacent pair of the plurality of guide recesses, the support face supporting the light guide introduced into the bearing opening, the guide recesses extending laterally radially away from the center of the bearing opening; and
a spring (76) disposed between the retaining frame (10) and the spacer (15) and configured to bias the spacer (15) towards the printed circuit board (4) without biasing the optical unit (8).

21. A lighting system, comprising
an optical unit, which comprises at least one light guide, which is provided for at least one light source;
a retaining frame for the optical unit, said frame fastening the optical unit to a printed circuit board comprising the at least one light source; and a spacer for positioning the optical unit, which spacer is arranged between the retaining frame and the printed circuit board, the spacer having at least one bearing opening configured to receive the at least one light guide, the bearing opening having an inwardly facing circumferential inner edge surrounding a center of the bearing opening;

wherein a plurality of guide recesses is formed on the edge of the at least one bearing opening and at least one support face is provided on the edge between an adjacent pair of the plurality of guide recesses, the support face supporting the light guide introduced into the bearing opening, the guide recesses extending laterally radially away from the center of the bearing opening;

wherein the retaining frame (10) defines a plurality of through-recesses (20), each through-recess (20) configured to receive a respective light inlet portion (74) of the at least one light guide (22), the plurality of through-recesses (20) spaced vertically above and in register with a respective said guide recess (94) of the plurality of guide recesses (94); and a spring (76) disposed between the retaining frame (10) and the spacer (15) and configured to bias the spacer (15) towards the printed circuit board (4) without biasing the optical unit (8).

22. A headlamp, comprising a lighting system, comprising:

an optical unit, which comprises at least one light guide, which is provided for at least one light source;

a retaining frame for the optical unit, said frame fastening the optical unit to a printed circuit board comprising the at least one light source; and a spacer for positioning the optical unit, which spacer is arranged between the retaining frame and the printed circuit board, the spacer having at least one bearing opening configured to receive the at least one light guide, the bearing opening having an inwardly facing circumferential inner edge surrounding a center of the bearing opening;

wherein a plurality of guide recesses is formed on the edge of the at least one bearing opening and at least one support face is provided on the edge between an adjacent pair of the plurality of guide recesses, the support face supporting the light guide introduced into the bearing opening, the guide recesses extending laterally radially away from the center of the bearing opening;

wherein the retaining frame (10) defines a plurality of through-recesses (20), each through-recess (20) configured to receive a respective light inlet portion (74) of the at least one light guide (22), the plurality of through-recesses (20) spaced vertically above and in register with a respective said guide recess (94) of the plurality of guide recesses (94); and a spring (76) disposed between the retaining frame (10) and the spacer (15) and configured to bias the spacer (15) towards the printed circuit board (4) without biasing the optical unit (8).

23. A method for producing a lighting system, the lighting system comprising:

an optical unit, which comprises at least one light guide, which is provided for at least one light source;

a retaining frame for the optical unit, said frame fastening the optical unit to a printed circuit board comprising the at least one light source; and a spacer for positioning the optical unit, which spacer is arranged between the retaining frame and the printed circuit board, the spacer having at least one bearing opening configured to receive the at least one light guide, the bearing opening having an inwardly facing circumferential inner edge surrounding a center of the bearing opening;

wherein a plurality of guide recesses is formed on the edge of the at least one bearing opening and at least one support face is provided on the edge between an adjacent pair of the plurality of guide recesses, the support face supporting the light guide introduced into the bearing opening, the guide recesses extending laterally radially away from the center of the bearing opening;

further comprising:

connecting the retaining frame to the spacer; and inserting the optical unit into the retaining frame and the spacer;

wherein the retaining frame (10) defines a plurality of through-recesses (20), each through-recess (20) configured to receive a respective light inlet portion (74) of the at least one light guide (22), the plurality of through-recesses (20) spaced vertically above and in register with a respective said guide recess (94) of the plurality of guide recesses (94), thereby guiding each said inlet portion (74) of a respective said light guide (22) at spaced locations along a longitudinal axis; and disposing a spring (76) between the retaining frame (10) and the spacer (15); and biasing the spacer (15) towards the printed circuit board (4) without biasing the optical unit (8).

* * * * *